United States Patent
Machida

(10) Patent No.: US 11,262,137 B2
(45) Date of Patent: Mar. 1, 2022

(54) LOOP-TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/423,749

(22) Filed: May 28, 2019

(65) Prior Publication Data

US 2019/0368820 A1 Dec. 5, 2019

(30) Foreign Application Priority Data

May 30, 2018 (JP) .............................. JP2018-103266

(51) Int. Cl.
*F28D 15/02* (2006.01)
*H05K 7/20* (2006.01)

(52) U.S. Cl.
CPC ..... *F28D 15/0266* (2013.01); *F28D 15/0233* (2013.01); *H05K 7/20336* (2013.01)

(58) Field of Classification Search
CPC .. F28F 2260/02; F28F 13/003; F28F 2255/18; F28F 2215/04; F28D 2021/0028; F28D 2021/0029; H01L 23/34; H01L 23/473; H01L 23/46; H01L 23/467
USPC ....................................................... 165/80.4
See application file for complete search history.

(56) References Cited

U.S. PATENT DOCUMENTS

| 2005/0022978 A1* | 2/2005 | Duval ................. F28D 15/0233 165/104.26 |
| 2007/0056711 A1* | 3/2007 | Ohsawa .............. F28D 15/0233 165/104.21 |
| 2009/0139696 A1* | 6/2009 | Shih ....................... F28F 1/022 165/104.26 |

(Continued)

FOREIGN PATENT DOCUMENTS

| EP | 3524912 A1 | 8/2019 | |
| JP | 2011242061 A * | 12/2011 | ........... F28D 15/046 |

(Continued)

OTHER PUBLICATIONS

European Search Report dated Oct. 15, 2019, 9 pages.
Japanese Office Action with English Translation dated Nov. 2, 2021, 8 pages.

*Primary Examiner* — Frantz F Jules
*Assistant Examiner* — Jason N Thompson
(74) *Attorney, Agent, or Firm* — Rankin, Hill & Clark LLP

(57) ABSTRACT

A loop-type heat pipe includes: an evaporator; a condenser; a liquid pipe; and a vapor pipe. The evaporator is formed by layered metal layers that include: a first outermost metal layer; a second outermost metal layer; and an inner layer. The inner layer includes: a first metal layer adjacent to the first outermost metal layer; and a second metal layer adjacent to the second outermost metal layer. At least one space and a porous member are provided in the inner layer. The first metal layer is formed with a first bottomed groove. The second metal layer is formed with a second bottomed groove. One end of the space corresponds to a portion of the first metal layer where the first bottomed groove is formed. The other end of the space corresponds to a portion of the second metal layer where the second bottomed groove is formed.

8 Claims, 10 Drawing Sheets

(56) References Cited

U.S. PATENT DOCUMENTS

| | | | |
|---|---|---|---|
| 2009/0323285 A1* | 12/2009 | Ryoson | H01L 23/427 |
| | | | 361/700 |
| 2010/0326632 A1* | 12/2010 | Nagai | F28F 3/086 |
| | | | 165/104.26 |
| 2010/0326644 A1* | 12/2010 | Hung | F28D 15/0283 |
| | | | 165/185 |
| 2013/0308272 A1 | 11/2013 | Furuta | |
| 2016/0259383 A1* | 9/2016 | Shioga | G06F 1/203 |
| 2017/0299239 A1* | 10/2017 | Steven | F25B 39/00 |
| 2018/0058767 A1 | 3/2018 | Machida et al. | |
| 2018/0142960 A1* | 5/2018 | Kurashima | H01L 23/427 |
| 2019/0293362 A1* | 9/2019 | Machida | H01L 23/427 |

FOREIGN PATENT DOCUMENTS

| | | |
|---|---|---|
| JP | 2015-183880 A | 10/2015 |
| JP | 2016-142416 A | 8/2016 |
| WO | 2015/087451 A1 | 6/2015 |
| WO | 2015/097451 | 7/2015 |

\* cited by examiner

LOOP-TYPE HEAT PIPE

This application claims priority from Japanese Patent Applications No. 2018-103266 filed on May 30, 2018, the entire contents of which are herein incorporated by reference.

BACKGROUND

1. Technical Field

The present disclosure relates to a loop-type heat pipe.

2. Background Art

A heat pipe has been known as a device for cooling a heat generating component such as a CPU (Central Processing Unit) mounted on an electronic apparatus. The heat pipe is a device for transporting heat by use of phase change of a working fluid.

A loop-type heat pipe has been enumerated as an example of such a heat pipe. The loop-type heat pipe includes an evaporator that vaporizes a working fluid by heat of a heat generating component, and a condenser that cools and liquefies the vaporized working fluid, wherein: the evaporator and the condenser are connected to each other by a liquid pipe and a vapor pipe that form a loop-like flow channel. In the loop-type heat pipe, the working fluid flows in the loop-like flow channel in one direction.

A porous member that holds the working fluid is provided inside the evaporator of the loop-type heat pipe. By heat given to the evaporator from the outside, the working fluid inside the porous member is vaporized so that vapor is generated. The porous member inside the evaporator is, for example, formed into a shape of comb teeth in plan view so that a space where the vapor flows is provided between adjacent ones of the comb teeth.

The evaporator is, for example, formed as a layered body of metal layers that includes outermost metal layers positioned on opposite outer sides in a layering direction of the metal layers, and inner layers positioned between the outermost metal layers positioned on the opposite outer sides. The space is formed by through holes formed in metal layers and communicating with one another, the metal layers constituting the inner layers. One end side of the space in the layering direction of the metal layers is closed by one of the outermost metal layers, and the other end side of the space in the layering direction of the metal layers is closed by the other outermost metal layer (see e.g., WO 2015/087451).

However, in the aforementioned structure, each of the one end side and the other end side of the space in the layering direction of the metal layers is closed by only one metal layer. Accordingly, strength in portions of the metal layers corresponding to the end portions of the space is insufficient. For this reason, when vapor is generated inside the space of the evaporator due to heat generated by the heat generating component mounted on a front surface of the evaporator through a thermally conductive adhesive agent etc., internal atmospheric pressure of the space increases. In this condition, the portions of the metal layers corresponding to the end portions of the space may not withstand the internal atmospheric pressure so as to be deformed to swell on the opposite outer sides. When the evaporator is deformed, a gap is generated between the front surface of the evaporator and the thermally conductive adhesive agent etc. so that there may arise a problem that, for example, heat transport efficiency from the heat generating component toward the evaporator is significantly deteriorated.

SUMMARY

Certain embodiments provide a loop-type heat pipe.

The loop-type heat pipe comprises:
an evaporator that vaporizes a working fluid;
a condenser that liquefies the working fluid;
a liquid pipe by which the evaporator and the condenser are connected to each other; and
a vapor pipe by which the evaporator and the condenser are connected to each other, wherein the vapor pipe and the liquid pipe form a loop.

The evaporator is formed by layered metal layers that comprise:
a first outermost metal layer positioned on one outer side in a layering direction of the layered metal layers;
a second outermost metal layer positioned on the other outer side opposite to the one outer side in the layering direction; and
an inner layer positioned between the first outermost metal layer and the second outermost metal layer.

The inner layer comprises:
a first metal layer adjacent to the first outermost metal layer; and
a second metal layer adjacent to the second outermost metal layer.

At least one space where vapor generated by vaporizing the working fluid flows and a porous member that communicates with the at least one space are provided in the inner layer.

The first metal layer is formed with a first bottomed groove opened to a side of the second metal layer.

The second metal layer is formed with a second bottomed groove opened to a side of the first metal layer side.

One end of the space in the layering direction corresponds to a portion of the first metal layer where the first bottomed groove is formed, and the other end of the space in the layering direction corresponds to a portion of the second metal layer where the second bottomed groove is formed.

DETAILED DESCRIPTION

The present disclosure will be described below with reference to the drawings. Incidentally, in the respective drawings, the same constituent portions will be referred to by the same signs respectively and correspondingly so that duplicate description thereof may be omitted.

First Embodiment

[Structure of Loop-Type Heat Pipe According to First Embodiment]

Figure 1:
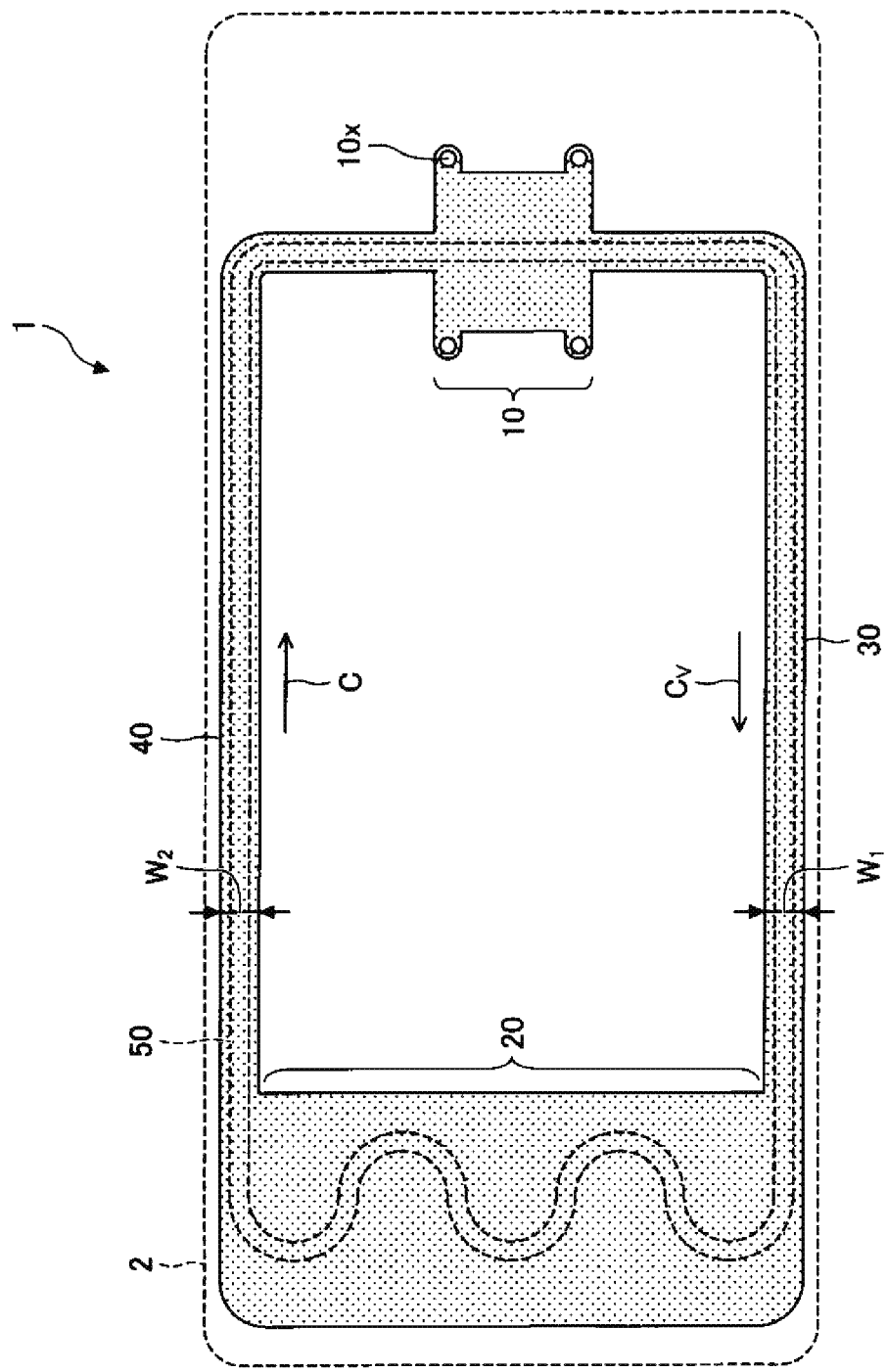
FIG. 1 is a schematic plan view illustrating a loop-type heat pipe according to a first embodiment.

First, a structure of a loop-type heat pipe according to a first embodiment will be described. FIG. 1 is a schematic plan view illustrating the loop-type heat pipe according to the first embodiment.

With reference to FIG. 1, the loop-type heat pipe 1 has an evaporator 10, a condenser 20, a vapor pipe 30, and a liquid pipe 40. The loop-type heat pipe 1 can be received, for example, in a mobile type electronic apparatus 2 such as a smartphone or a tablet terminal.

In the loop-type heat pipe 1, the evaporator 10 is configured to vaporize a working fluid C to generate vapor Cv. The condenser 20 is configured to liquefy the vapor Cv of the working fluid C. The evaporator 10 and the condenser 20 are connected to each other by the vapor pipe 30 and the liquid pipe 40. A flow channel 50 as a loop where the working fluid C or the vapor Cv flows is formed by the vapor pipe 30 and the liquid pipe 40.

Figure 2:
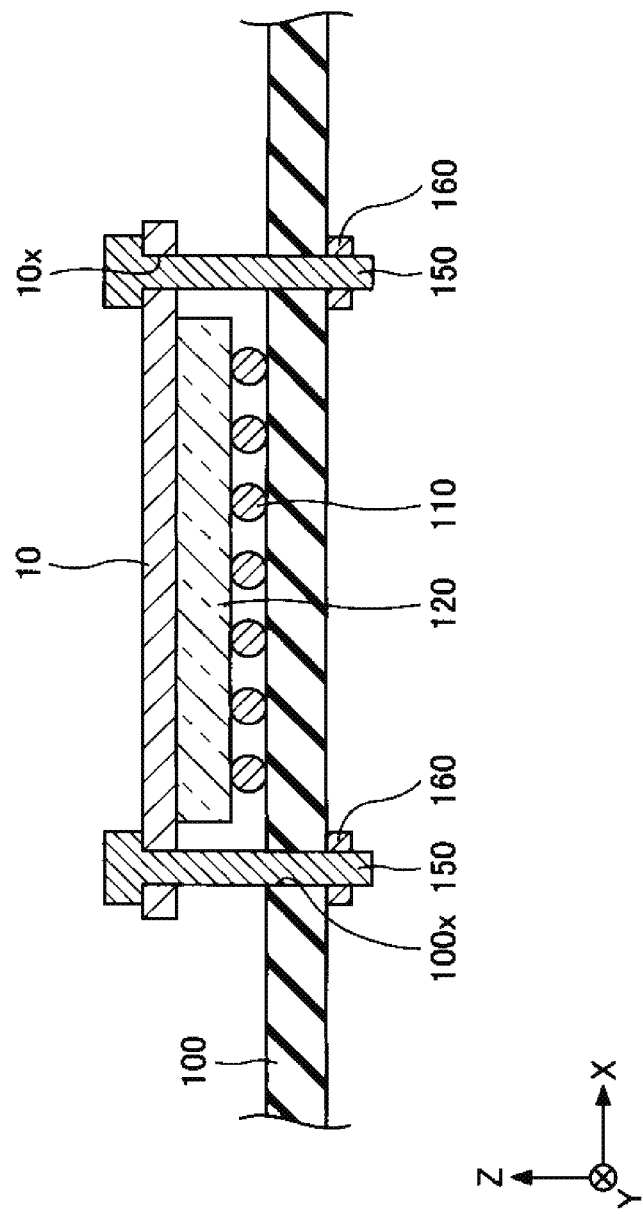
FIG. 2 is a sectional view of an evaporator and the vicinity thereof in the loop-type heat pipe according to the first embodiment.

FIG. 2 is a sectional view of the evaporator and the vicinity thereof in the loop-type heat pipe according to the first embodiment. As shown in FIG. 1 and FIG. 2, for example, four through holes 10x are formed in the evaporator 10. Bolts 150 are inserted respectively into the through holes 10x formed in the evaporator 10 and through holes 100x formed in a circuit board 100, and then stopped respectively by nuts 160 from a lower surface side of the circuit board 100. Thus, the evaporator 10 and the circuit board 100 are fixed to each other.

For example, a heat generating component 120 such as a CPU is mounted on the circuit board 100 by bumps 110. An upper surface of the heat generating component 120 closely contacts with a lower surface of the evaporator 10 through a thermally conductive adhesive agent etc. The working fluid C inside the evaporator 10 is vaporized by heat generated by the heat generating component 120 so that vapor Cv is generated.

As shown in FIG. 1, the vapor Cv generated in the evaporator 10 is guided to the condenser 20 through the vapor pipe 30 to be liquefied in the condenser 20. Thus, the heat generated by the heat generating component 120 moves to the condenser 20 so that a temperature increase of the heat generating component 120 can be suppressed. The working fluid C liquefied by the condenser 20 is guided to the evaporator 10 through the liquid pipe 40. A width $W_1$ of the vapor pipe 30 can be, for example, set at about 8 mm. In addition, a width $W_2$ of the liquid pipe 40 can be, for example, set at about 6 mm.

The kind of the working fluid C is not particularly limited. However, it is preferable that a fluid high in vapor pressure and large in latent heat of vaporization is used in order to efficiently cool the heat generating component 120 by the latent heat of vaporization. For example, ammonia, water, chlorofluorocarbon, alcohol and acetone can be enumerated as such a fluid.

The evaporator 10, the condenser 20, the vapor pipe 30, and the liquid pipe 40 can be formed into a structure in which, for example, a plurality of metal layers are layered on each another. Each of the metal layers is, for example, a copper layer excellent in thermal conductivity. The metal layers are directly bonded to one another by solid phase bonding etc. Each of the metal layers can be, for example, set at about 50 μm to 200 μm thick.

Incidentally, the metal layer is not limited to a copper layer but may formed as a stainless steel layer, an aluminum layer, a magnesium alloy layer, or the like. In addition, the number of the layered metal layers is not particularly limited.

Figure 3:
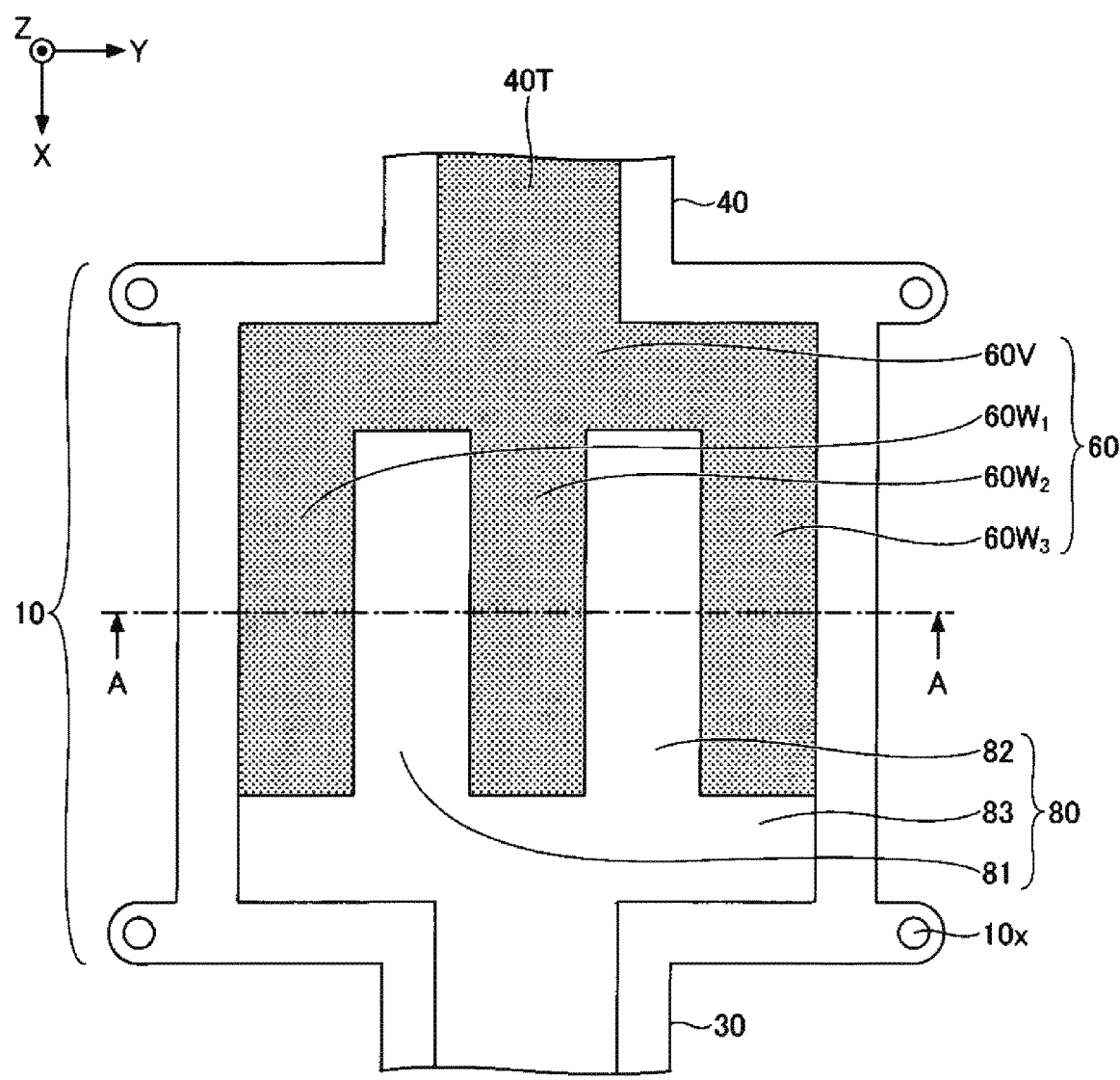
FIG. 3 is a partial plan view of the evaporator and the vicinity thereof in the loop-type heat pipe according to the first embodiment.

FIG. 3 is a partial plan view of the evaporator and the vicinity thereof in the loop-type heat pipe according to the first embodiment. In FIG. 3, illustration of a metal layer (a metal layer 61 shown in FIG. 4B) as one of outermost layers of a porous member 60 has been omitted in order to show the planar shape of the porous member 60 inside the evaporator 10. In addition, an X direction shown in FIG. 3 indicates a direction going from the liquid pipe 40 side toward the vapor pipe 30 side, and a Y direction shown in FIG. 3 indicates a direction perpendicular to the direction going from the liquid pipe 40 side toward the vapor pipe 30 side.

The porous member 60 inside the evaporator 10 shown in FIG. 3 includes a coupling portion 60V, and protrusions $60W_1$, $60W_2$ and $60W_3$.

In plan view, the coupling portion 60V is provided on a side closest to the liquid pipe 40 in the X direction (a side where the liquid pipe 40 is connected to the evaporator 10), and extends in the Y direction. A liquid pipe 40-side surface of the coupling portion 60V has a portion adjacent to a pipe wall of the evaporator 10, and a remaining portion connected to a porous member 40T provided inside the flow channel of the liquid pipe 40. In addition, a vapor pipe 30-side surface of the coupling portion 60V has portions coupled with the protrusions $60W_1$, $60W_2$ and $60W_3$, and remaining portions adjacent respectively to spaces 81 and 82 which will be described later.

The protrusions $60W_1$, $60W_2$ and $60W_3$ protrude from the coupling portion 60V toward the vapor pipe 30 side in plan view.

The protrusions $60W_1$, $60W_2$ and $60W_3$ are disposed in parallel with one another in the Y direction at predetermined intervals. Vapor pipe 30-side end portions of the protrusions $60W_1$, $60W_2$ and $60W_3$ are separate from the pipe wall of the evaporator 10. The vapor pipe 30-side end portions of the protrusions $60W_1$, $60W_2$ and $60W_3$ are not coupled with one another. On the other hand, liquid pipe 40-side end portions of the protrusions $60W_1$, $60W_2$ and $60W_3$ are coupled with one another through the coupling portion 60V. In other words, the porous member 60 inside the evaporator 10 is formed into a shape of comb teeth having the coupling portion 60V and the protrusions $60W_1$, $60W_2$ and $60W_3$ in plan view.

Inside the evaporator 10, a space 80 is formed in a region where the porous member 60 is not provided. The space 80 is connected to the flow channel of the vapor pipe 30. The space 80 has a space 81, a space 82, and a space 83. The space 81 is provided between the adjacent protrusions $60W_1$ and $60W_2$. The space 82 is provided between the adjacent protrusions $60W_2$ and $60W_3$. The space 83 is connected to the spaces 81 and 82. The space 83 is provided on a side closest to the vapor pipe 30 in the X direction (a side where the vapor pipe 30 is connected to the evaporator 10) in plan view.

The working fluid C is guided from the liquid pipe 40 side into the evaporator 10 to permeate the porous member 60. The working fluid C permeating the porous member 60 inside the evaporator 10 is vaporized by heat generated by the heat generating component 120 so that vapor Cv is generated. The vapor Cv flows into the vapor pipe 30 through the space 80 inside the evaporator 10. That is, the space 80 constitutes a portion of the flow channel 50.

Incidentally, the case where the number of the protrusions (comb teeth) is three (the protrusions $60W_1$, $60W_2$ and $60W_3$) in FIG. 3 is merely an example. The number of the protrusions (comb teeth) can be determined suitably. A contact area between the protrusions and the space 80 increases as the number of the protrusions increases. Accordingly, the working fluid C is easily vaporized so that pressure loss can be reduced.

The protrusions $60W_1$, $60W_2$ and $60W_3$ constituting the porous member 60 and the spaces 81 and 82 constituting the space 80 will be described below in detail.

Figure 4A:
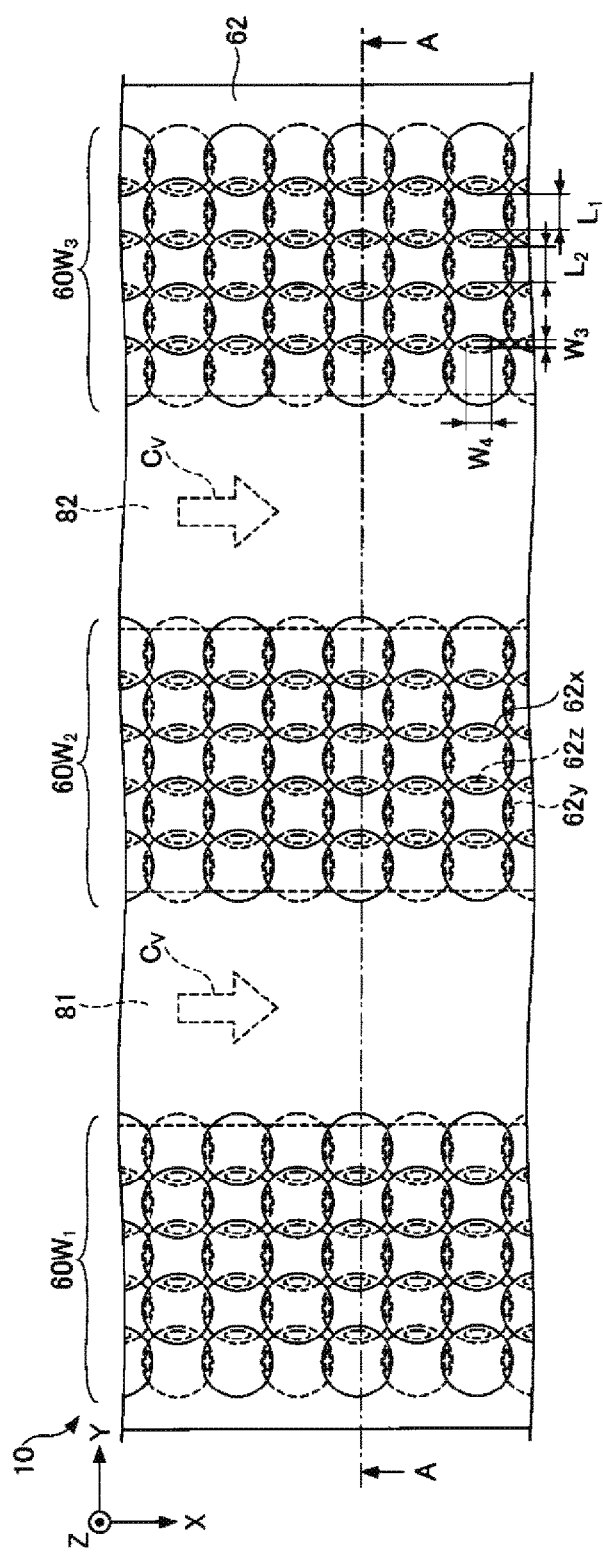
FIGS. 4A and 4B are views illustrating a porous member and spaces provided in the evaporator according to the first embodiment.
Figure 4B:
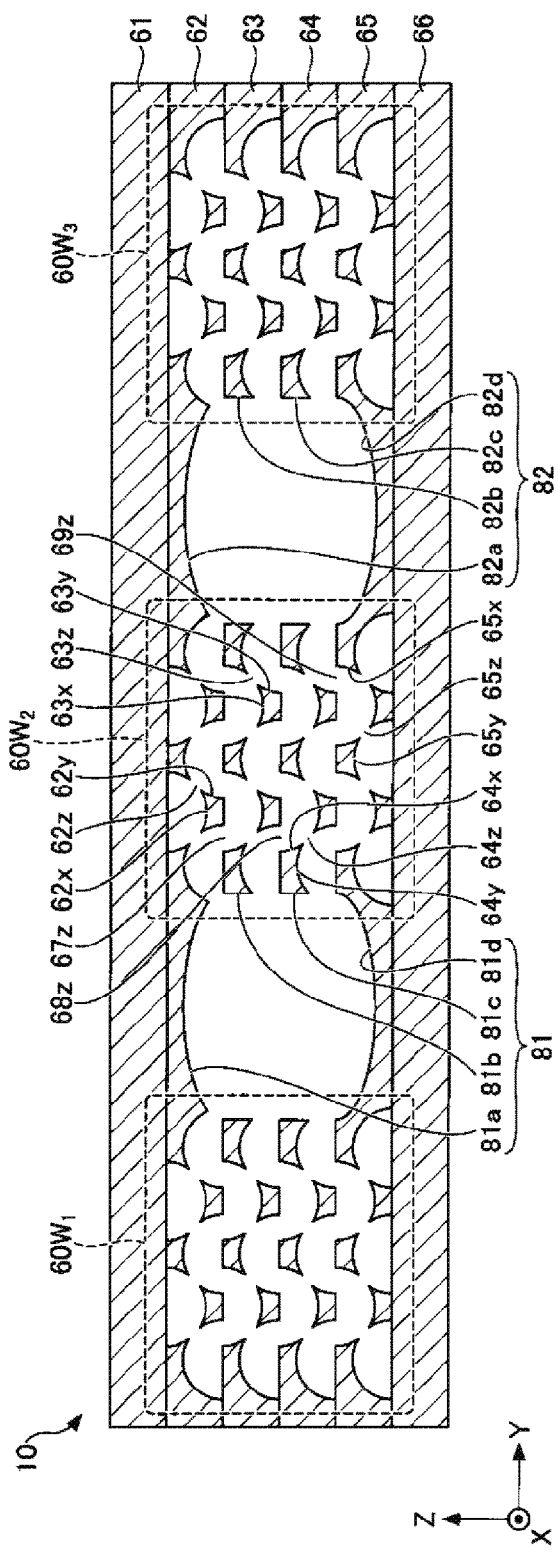

FIGS. 4A and 4B are views illustrating the porous member and the spaces provided inside the evaporator according to the first embodiment. FIG. 4A shows a partial plan view of the vicinity of a line A-A of FIG. 3. FIG. 4B shows a section taken along the line A-A of FIG. 3 (FIG. 4A). However, FIG. 4B is a sectional view also including the metal layer 61 whose illustration as one (an uppermost layer) of outermost layers of the porous member 60 has been omitted from FIG. 3 (FIG. 4A).

As shown FIGS. 4A and 4B, the evaporator 10 has a structure in which six layers, i.e. metal layers 61 to 66, are layered on one another. In the evaporator 10, the metal layers 61 and 66 are the outermost metal layers positioned on opposite outer sides in a layering direction of the metal layers, and the metal layers 62 to 65 are inner layers positioned between the outermost metal layers on the opposite outer sides. As shown in FIGS. 4A and 4B, the number of the inner layers is set at four by way of example. However, the inner layers can be constituted by two or more metal layers including a metal layer adjacent to one of the outermost metal layers, and a metal layer adjacent to the other outermost metal layer. That is, the number of the inner layers may be set at two, three or five or more.

For example, the metal layers 61 to 66 are copper layers excellent in thermal conductivity. The metal layers 61 to 66 are bonded directly to one another by solid phase bonding etc. Each of the metal layers 61 to 66 can be, for example, set to be about 50 μm to 200 μm thick. Incidentally, the metal layer 61 to 66 is not limited to a copper layer but may be formed as a stainless steel layer, an aluminum layer, a magnesium alloy layer, etc.

The protrusions $60W_1$, $60W_2$ and $60W_3$ constituting the porous member 60 and the spaces 81 and 82 constituting the space 80 are provided in the inner layers (the metal layers 62 to 65) of the evaporator 10. The protrusion $60W_1$ is provided on one end side of the space 81 in the Y direction. The protrusion $60W_2$ is provided on the other end side of the space 81 in the Y direction. In addition, the protrusion $60W_2$ is provided on one end side of the space 82 in the Y direction, and the protrusion $60W_3$ is provided on the other end side of the space 82 in the Y direction. In other words, the protrusions $60W_1$ and $60W_2$ are provided to surround the space 81 from the opposite sides, and the protrusions $60W_2$ and $60W_3$ are provided to surround the space 82 from the opposite sides. In addition, the spaces 81 and 82 are provided to surround the protrusion $60W_2$ from the opposite sides.

Bottomed holes (which will be described later) formed in the protrusion $60W_1$ communicate with the space 81. Bottomed holes formed in the protrusion $60W_2$ communicate with the spaces 81 and 82. Bottomed holes formed in the protrusion $60W_3$ communicate with the space 82. Thus, vapor Cv generated by vaporizing the working fluid C permeating the porous member 60 can flow out of the protrusions $60W_1$, $60W_2$ and $60W_3$ into the spaces 81 and 82. In addition, since the protrusion $60W_2$ is provided substantially in a central portion of the evaporator 10, the protrusion $60W_2$ also functions as a support column. Thus, the evaporator 10 can be prevented from collapsing, for example, due to pressure applied during the solid phase bonding.

The space 81 is formed by a bottomed groove 81a, a through hole 81b, a through hole 81c and a bottomed groove 81d that communicate with one another in the layering direction of the metal layers. One end side of the space 81 in the layering direction of the metal layers is closed by a portion of the metal layer 62 where the bottomed groove 81a is formed. The other end side of the space 81 in the layering direction of the metal layers is closed by a portion of the metal layer 65 where the bottomed groove 81d is formed. In addition, the space 82 is formed by a bottomed groove 82a, a through hole 82b, a through hole 82c and a bottomed groove 82d that communicate with one another in the layering direction of the metal layers. One end side of the space 82 in the layering direction of the metal layers is closed by a portion of the metal layer 62 where the bottomed groove 82a is formed. The other end side of the space 82 in the layering direction of the metal layers is closed by a portion of the metal layer 65 where the bottomed groove 82d is formed.

More specifically, in the spaces 81 and 82, the bottomed grooves 81a and 82a opened to the metal layer 63 side are formed in the metal layer 62. In addition, the through holes 81b and 82b penetrating the metal layer 63 are formed in the metal layer 63. In addition, the through holes 81c and 82c penetrating the metal layer 64 are formed in the metal layer 64. In addition, the bottomed grooves 81d and 82d opened to the metal layer 64 side are formed in the metal layer 65.

A width of a largest opening portion of the bottomed groove 81a, a width of the through hole 81b, a width of the through hole 81c and a width of a largest opening portion of the bottomed groove 81d are substantially the same. Similarly, a width of a largest opening portion of the bottomed groove 82a, a width of the through hole 82b, a width of the through hole 82c and a width of a largest opening portion of the bottomed groove 82d are substantially the same.

Each of the bottomed grooves 81a and 82a and the bottomed grooves 81d and 82d can be, for example, formed into a concave shape in which an inner wall surface of the bottomed groove includes a curved surface.

A sectional shape of each of the bottomed grooves 81a and 82a and the bottomed grooves 81d and 82d parallel with a YZ, plane can be, for example, formed as an approximately semicircular shape or an approximately semielliptical shape. Here, the approximately semicircular shape may include not only a semicircle obtained by halving a perfect circle, but also a shape whose circular arc is, for example, longer or shorter than that of the semicircle. In addition, the approximately semielliptical shape may include not only a semiellipse obtained by halving an ellipse, but also a shape whose circular arc is, for example, longer or shorter than that of the semiellipse. A sectional shape of each of the spaces 81 and 82 parallel with the YZ plane can be formed as an approximately rectangular shape in which, for example, an upper side and a lower side of the space are curved convexly.

In the porous member 60 including the protrusions $60W_1$, $60W_2$ and $60W_3$, no hole or groove is formed in the first metal layer 61 (one of the outermost metal layers) and the sixth metal layer 66 (the other outermost metal layer) (i.e. the outermost layers are solid). On the other hand, bottomed holes 62x and bottomed holes 62y are formed in the metal layer 62. Each of the bottomed holes 62x is recessed from an upper surface side of the metal layer 62 toward a thicknesswise substantially central portion of the metal layer 62. Each of the bottomed holes 62y is recessed from a lower surface side of the metal layer 62 toward a thicknesswise substantially central portion of the metal layer 62.

The bottomed holes 62x and the bottomed holes 62y are disposed alternately in the X direction in plan view. In addition, the bottomed holes 62x and the bottomed holes 62y are disposed alternately in the Y direction in plan view. The bottomed holes 62x and the bottomed holes 62y disposed alternately in the X direction partially overlap each other in plan view. The overlapping portions of the bottomed holes 62x and the bottomed holes 62y communicate with each other to thereby form narrow holes 62z respectively. In addition, the bottomed holes 62x and the bottomed holes 62y disposed alternately in the Y direction partially overlap each other in plan view. The overlapping portions of the bottomed holes 62x and the bottomed holes 62y communicate with each other to thereby form narrow holes 62z respectively.

A planar shape of each of the bottomed holes 62x and 62y can be, for example, formed as a circle with a diameter of about 100 µm to 300 µm. However, the planar shape of the bottomed hole 62x, 62y may be any desired shape such as an ellipse or a polygon. A depth of the bottomed hole 62x, 62y can be, for example, set to be about half the thickness of the metal layer 62. An interval $L_1$ between adjacent ones of the bottomed holes 62x in the Y direction can be, for example, set at about 100 µm to 400 µm. An interval between adjacent ones of the bottomed holes 62y in the X direction is also similar or the same. An interval $L_2$ between adjacent ones of the bottomed holes 62y in the Y direction can be, for example, set at about 100 µm to 400 µm. An interval between adjacent ones of the bottomed holes 62y in the X direction is also similar or the same.

As for the bottomed hole 62x, 62y, each of a sectional shape parallel with an XZ plane and a sectional shape parallel with the YZ plane can be, for example, formed as an approximately semicircular shape or an approximately semielliptical shape. However, as for the bottomed hole 62x, 62y, each of the sectional shape parallel with the XZ plane and the sectional shape parallel with the YZ plane may be a tapered shape widened from the bottom side of the bottomed hole 62x, 62y toward the opening side of the bottomed hole 62x, 62y or a shape perpendicular to the bottom of the bottomed hole 62x, 62y.

A short width $W_3$ of each narrow hole 62z can be, for example, about 10 µm to 50 µm. In addition, a long width $W_4$ of the narrow hole 62z can be, for example, about 50 µm to 150 µm.

Bottomed holes 63x and bottomed holes 63y are formed in the metal layer 63. Each of the bottomed holes 63x is recessed from an upper surface side of the metal layer 63 toward a thicknesswise substantially central portion of the metal layer 63. Each of the bottomed holes 63y is recessed from a lower surface side of the metal layer 63 toward a thicknesswise substantially central portion of the metal layer 63.

The bottomed holes 63x and the bottomed holes 63y are disposed alternately in the X direction in plan view. In addition, the bottomed holes 63x and the bottomed holes 63y are disposed alternately in the Y direction in plan view. The bottomed holes 63x and the bottomed holes 63y disposed alternately in the X direction partially overlap each other in plan view. The overlapping portions of the bottomed holes 63x and the bottomed holes 63y communicate with each other to thereby form narrow holes 63z respectively. In addition, the bottomed holes 63x and the bottomed holes 63y disposed alternately in the Y direction partially overlap each other in plan view. The overlapping portions of the bottomed holes 63x and the bottomed holes 63y communicate with each other to thereby form narrow holes 63z respectively. The shapes of the bottomed holes 63x and 63y and the narrow holes 63z can be, for example, made similar to or the same as the shapes of the bottomed holes 62x and 62y and the narrow holes 62z.

In addition, the bottomed holes 62y of the metal layer 62 and the bottomed holes 63x of the metal layer 63 partially overlap each other respectively in plan view. The overlapping portions of the bottomed holes 62y and the bottomed holes 63x communicate with each other to thereby form narrow holes 67z respectively.

Bottomed holes 64x and bottomed holes 64y are formed in the metal layer 64. Each of the bottomed holes 64x is recessed from an upper surface side of the metal layer 64 toward a thicknesswise substantially central portion of the metal layer 64. Each of the bottomed holes 64y is recessed from a lower surface side of the metal layer 64 toward a thicknesswise substantially central portion of the metal layer 64.

The bottomed holes 64x and the bottomed holes 64y are disposed alternately in the X direction in plan view. In addition, the bottomed holes 64x and the bottomed holes 64y are disposed alternately in the Y direction in plan view. The bottomed holes 64x and the bottomed holes 64y disposed alternately in the X direction partially overlap each other in plan view. The overlapping portions of the bottomed holes 64x and the bottomed holes 64y communicate with each other to thereby form narrow holes 64z respectively. In addition, the bottomed holes 64x and the bottomed holes 64y disposed alternately in the Y direction partially overlap each other in plan view. The overlapping portions of the bottomed holes 64x and the bottomed holes 64y communicate with each other to thereby form narrow holes 64z respectively. The shapes etc. of the bottomed holes 64x and 64y and the narrow holes 64z can be, for example, made similar to or the same as the shapes etc. of the bottomed holes 62x and 62y and the narrow holes 62z.

In addition, the bottomed holes 63y of the metal layer 63 and the bottomed holes 64x of the metal layer 64 partially overlap each other respectively in plan view. The overlapping portions of the bottomed holes 63y and the bottomed holes 64x communicate with each other to thereby form narrow holes 68z respectively.

Bottomed holes 65x and bottomed holes 65y are formed in the metal layer 65. Each of the bottomed holes 65x is recessed from an upper surface side of the metal layer 65 toward a thicknesswise substantially central portion of the metal layer 65. Each of the bottomed holes 65y is recessed from a lower surface side of the metal layer 65 toward a thicknesswise substantially central portion of the metal layer 65.

The bottomed holes 65x and the bottomed holes 65y are disposed alternately in the X direction in plan view. In addition, the bottomed holes 65x and the bottomed holes 65y are disposed alternately in the Y direction in plan view. The bottomed holes 65x and the bottomed holes 65y disposed alternately in the X direction partially overlap each other in plan view. The overlapping portions of the bottomed holes 65x and the bottomed holes 65y communicate with each other to thereby form narrow holes 65z respectively. In addition, the bottomed holes 65x and the bottomed holes 65y disposed alternately in the Y direction partially overlap each other in plan view. The overlapping portions of the bottomed holes 65x and the bottomed holes 65y communicate with each other to thereby form narrow holes 65z respectively. The shapes etc. of the bottomed holes 65x and 65y and the narrow holes 65z can be, for example, made similar to or the same as the shapes etc. of the bottomed holes 62x and 62y and the narrow holes 62z.

In addition, the bottomed holes 64y of the metal layer 64 and the bottomed holes 65x of the metal layer 65 partially overlap each other respectively in plan view. The overlapping portions of the bottomed holes 64y and the bottomed holes 65x communicate with each other to thereby form narrow holes 69z respectively.

The narrow holes formed in the metal layers communicate with each other respectively. The narrow holes communicating with each other respectively expand three-dimensionally inside the porous member 60 including the protrusions $60W_1$, $60W_2$ and $60W_3$. Therefore, the working fluid C is three-dimensionally spread inside the narrow holes communicating with each other respectively, due to capillary force.

In FIGS. 4A and 4B, the bottomed holes 62x, the bottomed holes 63x, the bottomed holes 64x and the bottomed holes 65x overlap one another in plan view, and the bottomed holes 62y, the bottomed holes 63y, the bottomed holes 64y and the bottomed holes 65y overlap one another in plan view. However, the present disclosure is not limited to this. That is, as long as the narrow holes communicating with one another can be three-dimensionally spread inside the porous member 60 including the protrusions $60W_1$, $60W_2$ and $60W_3$ in the form, the bottomed holes 62x, the bottomed holes 63x, the bottomed holes 64x and the bottomed holes 65x may not necessarily overlap one another in plan view. In addition, the bottomed holes 62y, the bottomed holes 63y, the bottomed holes 64y and the bottomed holes 65y may not necessarily overlap one another in plan view.

Thus, the porous member 60 including the protrusions $60W_1$, $60W_2$ and $60W_3$ is provided in the evaporator 10. Of the porous member 60 inside the evaporator 10, the working fluid C in a liquid phase permeates the portion near the liquid pipe 40. On this occasion, the capillary force acting on the working fluid C from the porous member 60 becomes pumping force for circulating the working fluid C inside the loop-type heat pipe 1.

Moreover, the capillary force acts against vapor Cv inside the evaporator 10. Accordingly, the vapor Cv can be suppressed from flowing back to the liquid pipe 40.

Incidentally, an injection port (not shown) for injecting the working fluid C is formed in the liquid pipe 40. The injection port is closed by a sealing member so that the inside of the loop-type heat pipe 1 can be kept airtight.

[Manufacturing Method of Loop-Type Heat Pipe According to First Embodiment]

Next, a manufacturing process of spaces and a porous member will be mainly described in a manufacturing method of a loop-type heat pipe according to the first embodiment. FIGS. 5A to 5D and FIGS. 6A and 6B are views illustrating the manufacturing process of the loop-type heat pipe according to the first embodiment. FIGS. 5A to 5D and FIGS. 6A and 6B show sections corresponding to FIG. 4B.

Figure 5A:
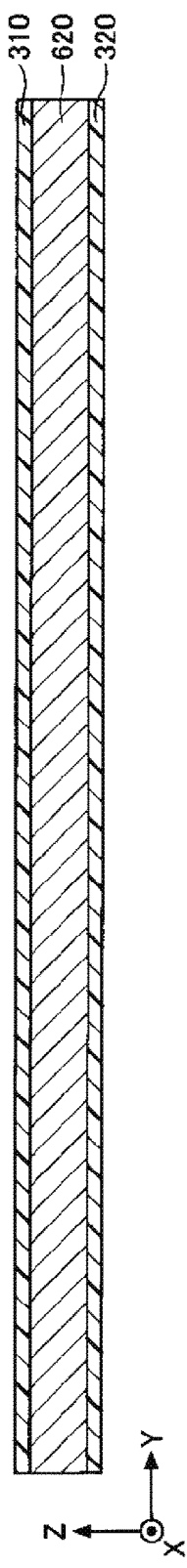
FIGS. 5A to 5D are views (Part 1) illustrating a manufacturing process of the loop-type heat pipe according to the first embodiment.

First, a metal sheet 620 formed into a planar shape of FIG. 1 is prepared in a step shown in FIG. 5A. A resist layer 310 is formed on an upper surface of the metal sheet 620, and a resist layer 320 is formed on a lower surface of the metal sheet 620. The metal sheet 620 is a member that will ultimately serve as a metal layer 62. The metal sheet 620 can be, for example, formed out of copper, stainless steel, aluminum, a magnesium alloy, etc. The metal sheet 620 can be, for example, set at about 50 μm to 200 μm thick. For example, a photosensitive dry film resist etc. can be used as each of the resist layers 310 and 320.

Figure 5B:
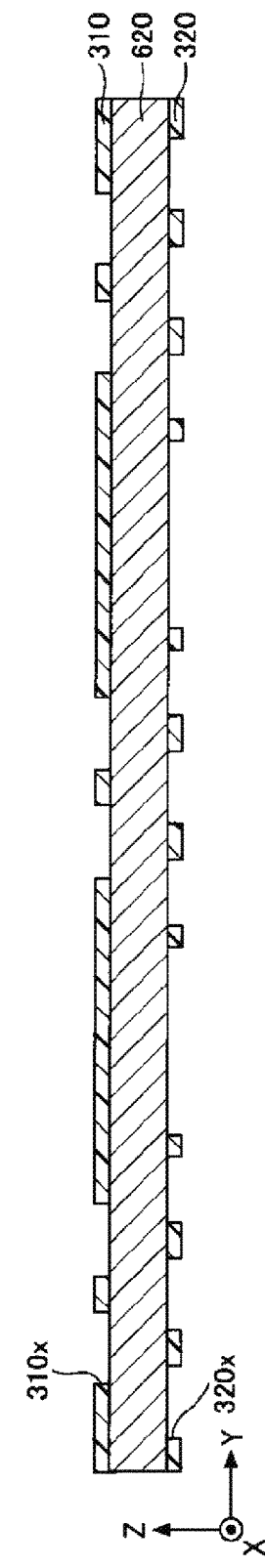

Next, in a step shown in FIG. 5B, the resist layers 310 and 320 are exposed to light and developed in regions for forming spaces 81, 82 and 83 (not shown in FIG. 5B) of the metal sheet 620 and a porous member 60 including protrusions $60W_1$, $60W_2$ and $60W_3$. Thus, opening portions 310x selectively exposing an upper surface of the metal sheet 620 are formed in the resist layer 310, and opening portions 320x selectively exposing a lower surface of the metal sheet 620 are formed in the resist layer 320. The opening portions 310x are formed to have a shape and a layout corresponding to the shape and the layout of the bottomed holes 62x shown in FIGS. 4A and 4B. In addition, the opening portions 320y are formed to have a shape and a layout corresponding to the shapes and the layouts of the bottomed grooves 81a and 82a and the bottomed holes 62y shown in FIGS. 4A and 4B. In addition, in a portion that will serve as a portion of the space 83, the opening portions 310x of the resist layer 310 and the opening portions 320x of the resist layer 320 are formed at positions overlapping each other respectively in plan view.

Figure 5C:
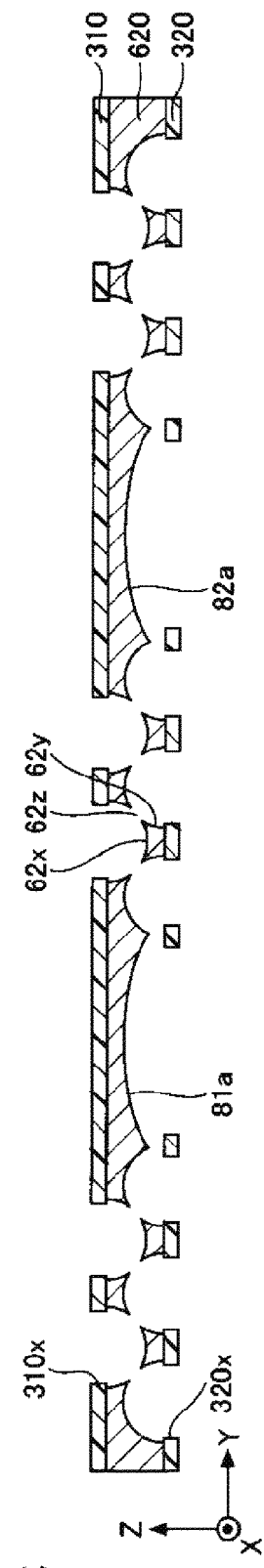

Next, in a step shown in FIG. 5C, the metal sheet 620 exposed inside the opening portions 310x is half-etched from the upper surface side of the metal sheet 620, and the metal sheet 620 exposed inside the opening portions 320x is half-etched from the lower surface side of the metal sheet 620. Thus, bottomed holes 62x are formed on the upper surface side of the metal sheet 620, and bottomed grooves 81a and 82a and bottomed holes 62y are formed on the lower surface side of the metal sheet 620. In addition, the opening portions 310x and the opening portions 320x disposed alternately in an X direction in the front and the back partially overlap each other respectively in plan view. Accordingly, the overlapping portions of the opening portions 310x and the opening portions 320x communicate with each other to thereby form narrow holes 62z respectively. In addition, through holes serving as the portion of the space 83 are formed. For example, a ferric chloride solution can be used for the half-etching of the metal sheet 620.

Figure 5D:
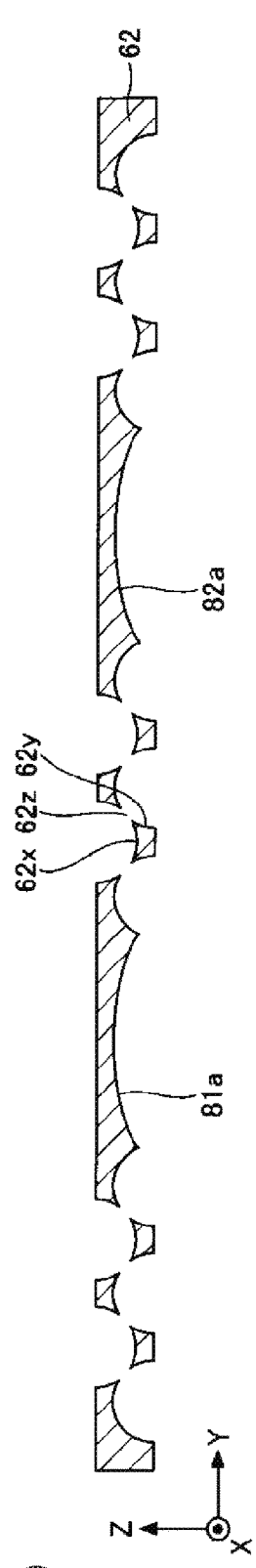

Next, in a step shown in FIG. 5D, the resist layers 310 and 320 are stripped by a stripping solution. Thus, the metal layer 62 is completed.

Figure 6A:
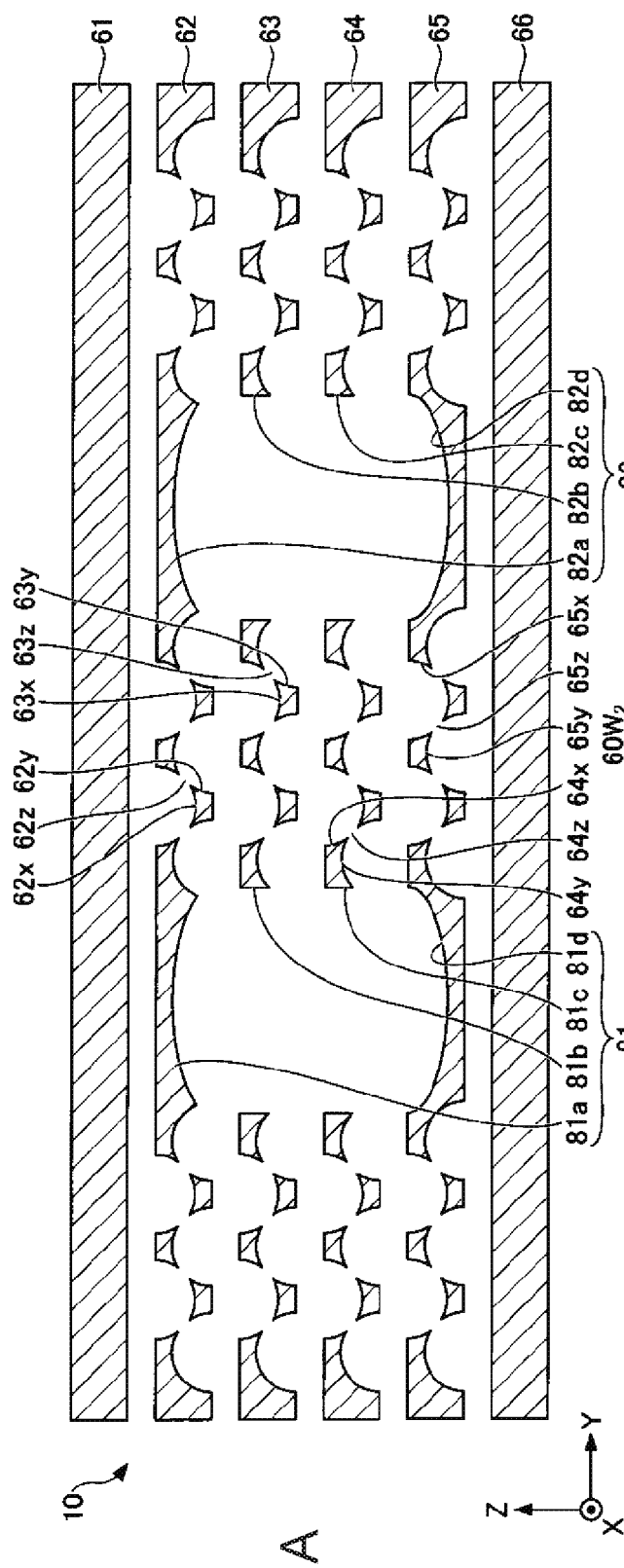
FIGS. 6A and 6B are views (Part 2) illustrating the manufacturing process of the loop-type heat pipe according to the first embodiment.

Next, in a step shown in FIG. 6A, solid metal layers 61 and 66 where no hole or groove is formed are prepared. In addition, by a similar method to or the same method as the metal layer 62, metal layers 63 to 65 are formed. Positions of bottomed grooves, through holes, bottomed holes and narrow holes can be formed in the metal layers 63 to 65, for example, as shown in FIG. 4B. Incidentally, in order to form through holes 81b and 81c and through holes 82b and 82c in the metal layers 63 and 64, opening portions 310x of a resist layer 310 and opening portions 320x of a resist layer 320 may be formed at positions overlapping each other respectively in plan view and then etched. In addition, in order to form the through holes that will serve as the portion of the space 83, the opening portions 310x of the resist layer 310 and the opening portions 320x of the resist layer 320 may be formed at positions overlapping each other respectively in plan view and then etched.

Figure 6B:
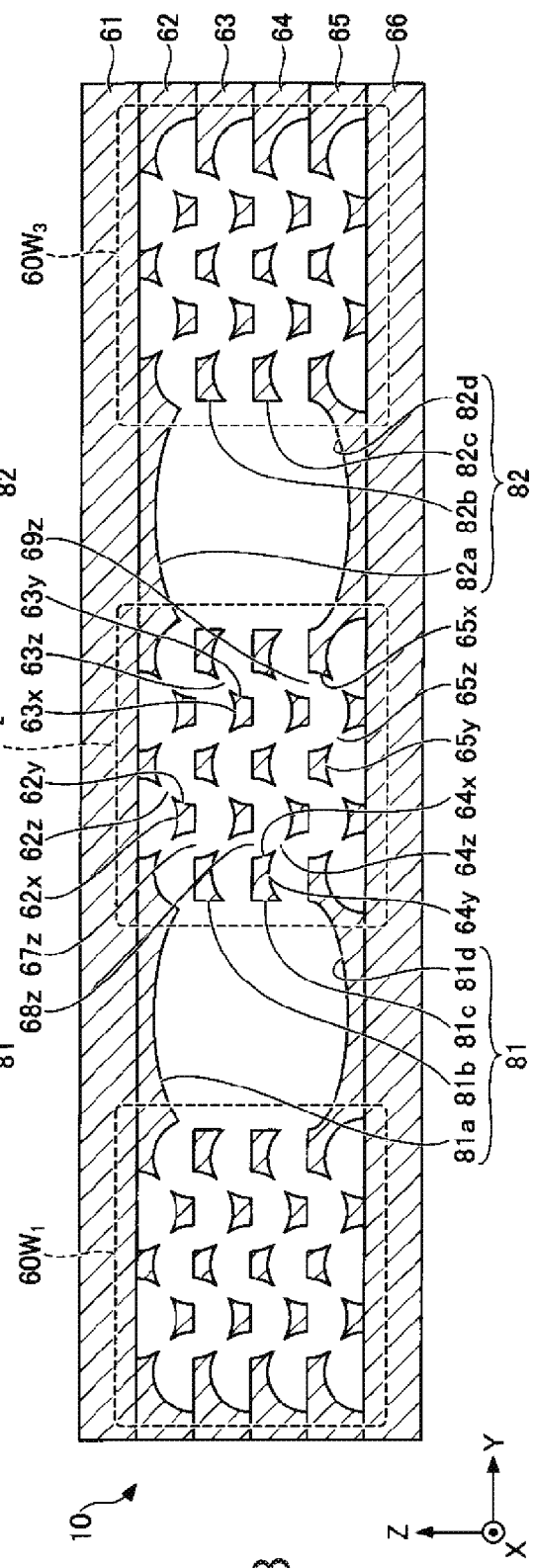

Next, in a step shown in FIG. 6B, the metal layers are layered on one another in a sequence shown in FIG. 6A to be subjected to solid phase bonding by pressure and heat applied thereto. Thus, adjacent ones of the metal layers are bonded to each other directly so that a loop-type heat pipe 1 having an evaporator 10, a condenser 20, a vapor pipe 30 and a liquid pipe 40 is completed. A space 80 including the spaces 81, 82 and 83 and the porous member 60 including the protrusions $60W_1$, $60W_2$ and $60W_3$ are formed in the evaporator 10. After the liquid pipe 40 is then evacuated by use of a vacuum pump etc., a working fluid C is injected into the liquid pipe 40 from a not-shown injection port. Then, the injection port is sealed.

Here, the solid phase bonding means a method in which subjects to be bonded are not melted but softened directly in a solid phase (solid) state by heat and further plastically deformed by pressure so as to be bonded to each other. Incidentally, it is preferable that all the materials of the metal layers 61 to 66 are made the same so that adjacent ones of the metal layers can be bonded to each other excellently by the solid phase bonding.

The structure is formed thus so that the bottomed holes formed from the opposite surface sides of the metal layers are made to partially communicate with each other to thereby form the narrow holes respectively in the metal layers. With this structure, it is possible to solve a problem inherent in a background-art narrow hole forming method in which metal layers where through holes are formed are layered on one another so that the through holes partially overlap each other respectively. That is, the narrow holes fixed in size can be formed in the metal layers without causing misalignment among the metal layers layered on one another or misalignment due to expansion and contraction of the metal layers during heating treatment on the metal layers layered on one another.

Thus, capillary force appearing due to the narrow holes can be prevented from being lowered due to variation in size among the narrow holes. Thus, it is possible to stably obtain an effect of suppressing vapor Cv from flowing back to the liquid pipe 40 from the evaporator 10.

In addition, the structure is formed so that adjacent ones of the bottomed holes are overlapped each other in the portions where the metal layers are layered on one another. With this structure, an area where the metal layers contact with one another can be increased so that the metal layers can be firmly bonded to one another.

An effect obtained by forming the bottomed grooves in the spaces 81 and 82 formed in the evaporator 10 will be described here together with a comparative example.

Figure 7A:
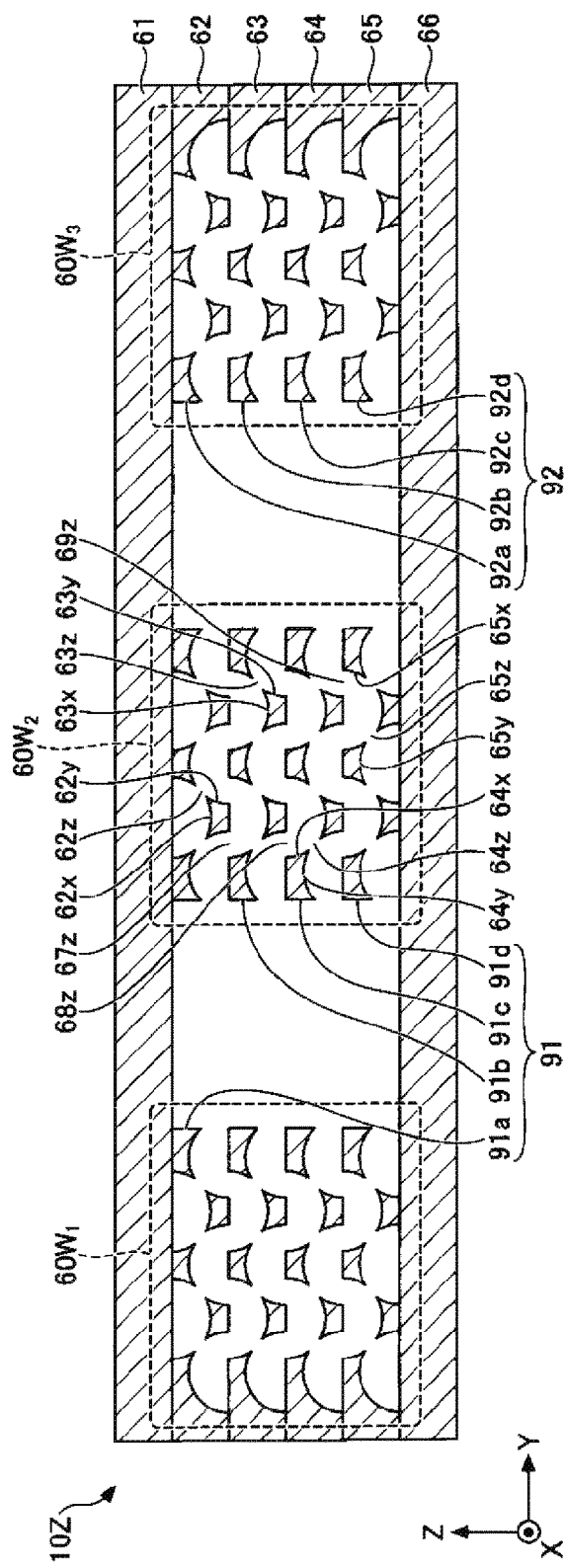
FIGS. 7A and 7B are sectional views illustrating a structure of an evaporator in a loop-type heat pipe according to a comparative example.
Figure 7B:
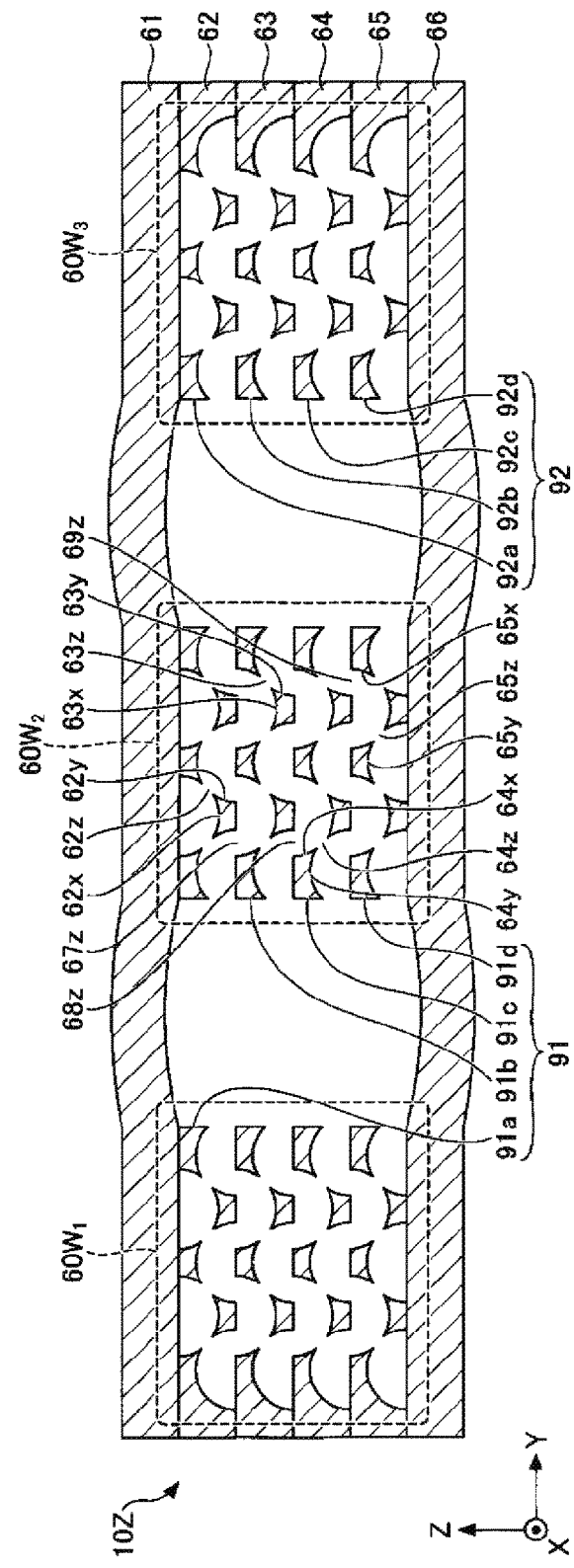

FIGS. 7A and 7B are sectional views illustrating a structure of an evaporator in a loop-type heat pipe according to the comparative example. As shown in FIG. 7A, the evaporator 10Z according to the comparative example is different from the evaporator 10 at a point that the spaces 81 and 82 are replaced with spaces 91 and 92.

The space 91 is formed by a through hole 91a, a through hole 91b, a through hole 91c and a through hole 91d communicating with one another. In addition, the space 92 is formed by a through hole 92a, a through hole 92b, a through hole 92c and a through hole 92d communicating with one another. One end sides of the spaces 91 and 92 in a layering direction of metal layers are closed by a lower surface of the metal layer 61 while the other end sides of the spaces 91 and 92 in the layering direction of the metal layers are closed by an upper surface of the metal layer 66.

More specifically, in the spaces 91 and 92, the through holes 91a and 92a penetrating the metal layer 62 are formed in the metal layer 62. In addition, the through holes 91b and 92b penetrating the metal layer 63 are formed in the metal layer 63. In addition, the through holes 91c and 92c penetrating the metal layer 64 are formed in the metal layer 64. In addition, the through holes 91d and 92d penetrating the metal layer 65 are formed in the metal layer 65. A width of the through hole 91a, a width of the through hole 91b, a width of the through hole 91c and a width of the through hole 91d are substantially the same. In a similar manner or the same manner, a width of the through hole 92a, a width of the through hole 92b, a width of the through hole 92c and a width of the through hole 92d are substantially the same.

Thus, the spaces 91 and 92 are formed by the through holes formed in the metal layers 62 to 65 and communicating with one another. No bottomed groove is formed in the metal layers 62 and 65. Therefore, strength in portions of the metal layer 61 corresponding to the one end sides of the spaces 91 and 92 in the layering direction of the metal layers and portions of the metal layer 66 corresponding to the other end sides of the spaces 91 and 92 in the layering direction of the metal layers is insufficient. As a result, the following problem arises.

That is, a heat generating component is mounted on a front surface of the evaporator 10Z through a thermally conductive adhesive agent etc. When the heat generating component generates heat, a working fluid C inside the evaporator 10Z is vaporized by the heat generated by the heat generating component 120 so that vapor Cv is generated. When the vapor Cv is generated inside the evaporator 10Z, internal atmospheric pressure of the evaporator 10Z partially increases. Particularly, the spaces 91 and 92 each positioned between adjacent ones of protrusions (comb teeth) are places where the atmospheric pressure becomes the highest momentarily. Therefore, when the vapor Cv is generated inside the evaporator 10Z, the portions of the metal layers 61 and 66 where the spaces 91 and 92 are formed cannot withstand the internal atmospheric pressure so that the portions of the metal layers 61 and 66 may be deformed to swell on opposite outer sides, as shown in FIG. 7B. When the evaporator 10Z is deformed, a gap is generated between the front surface of the evaporator 10Z and the thermally conductive adhesive agent etc. so that there may arise a problem that, for example, heat transport efficiency from the heat generating component toward the evaporator 10Z is significantly deteriorated.

On the other hand, in the present embodiment, the bottomed groove 81a is formed on one end side of the space 81 in the layering direction of the metal layers, and the bottomed groove 81d is formed on the other end side of the space 81 in the layering direction of the metal layers. In addition, the bottomed groove 82a is formed on one end side of the space 82 in the layering direction of the metal layers, and the bottomed groove 82d is formed on the other end side of the space 82 in the layering direction of the metal layers. That is, the one end side of the space 81 is closed by the metal layer 61 and the portion of the metal layer 62 where the bottomed groove 81a as a reinforcement portion is formed, and the other end side of the space 81 is closed by the metal layer 66 and the portion of the metal layer 65 where the bottomed groove 81d as a reinforcement portion is formed. In addition, the one end side of the space 82 is closed by the metal layer 61 and the portion of the metal layer 62 where the bottomed groove 82a as a reinforcement portion is formed, and the other end side of the space 82 is closed by the metal layer 66 and the portion of the metal layer 65 where the bottomed groove 82d as a reinforcement portion is formed.

Thus, strength in the portions of the metal layers corresponding to the one end sides and the other end sides of the spaces 81 and 82 is improved. Accordingly, even when vapor Cv is generated inside the evaporator 10, the portions of the metal layers corresponding to the spaces 81 and 82 can withstand the internal atmospheric pressure so that the evaporator 10 can be prevented from being deformed. As a result, no gap is generated between the front surface of the evaporator 10 and the thermally conductive adhesive agent etc. Accordingly, it is possible to prevent occurrence of such a problem that, for example, heat transport efficiency from the heat generating component toward the evaporator 10 is lowered.

Particularly, each of the bottomed grooves 81a and 82a and the bottomed grooves 81d and 82d as the reinforcement portions is formed into a concave shape in which an inner wall surface of the bottomed groove includes a curved surface. Thus, pressure can be applied to the bottomed grooves 81a and 82a and the bottomed grooves 81d and 82d uniformly. As a result, the spaces 81 and 82 can be formed into a structure stronger against deformation.

In addition, as the number of the metal layers layered on one another is larger and the spaces are therefore wider, the evaporator 10 can be used in a high atmospheric pressure state. Accordingly, as the number of the layered metal layers in the porous member 60 is larger, the significance of providing the reinforcement portions is higher.

Incidentally, there is also conceived a method in which each of the outermost metal layers on the opposite sides is made thicker than each of the metal layers constituting the inner layers so that the outermost metal layers are improved in strength so as to be prevented from being deformed. However, this method is not preferable at the point that the evaporator as a whole has to be thickened. On the other hand, a method using the bottomed grooves 81a and 82a and the bottomed grooves 81d and 82d as the reinforcement portions is preferable at a point that strength in the portions of the metal layers where the spaces are formed can be improved even when each of the outermost metal layers on the opposite sides is made not thicker than each of the metal layers constituting the inner layers (for example, even when all the metal layers are made to have the same thickness). That is, this method is preferable at a point that strength in the portions of the metal layers where the spaces are formed can be improved without thickening the evaporator as a whole.

Second Embodiment

An example of an evaporator having spaces different in sectional shape from those in the first embodiment will be shown in a second embodiment. Incidentally, description about the same constituent portions as those in the aforementioned embodiment may be omitted in the second embodiment.

Figure 8A:
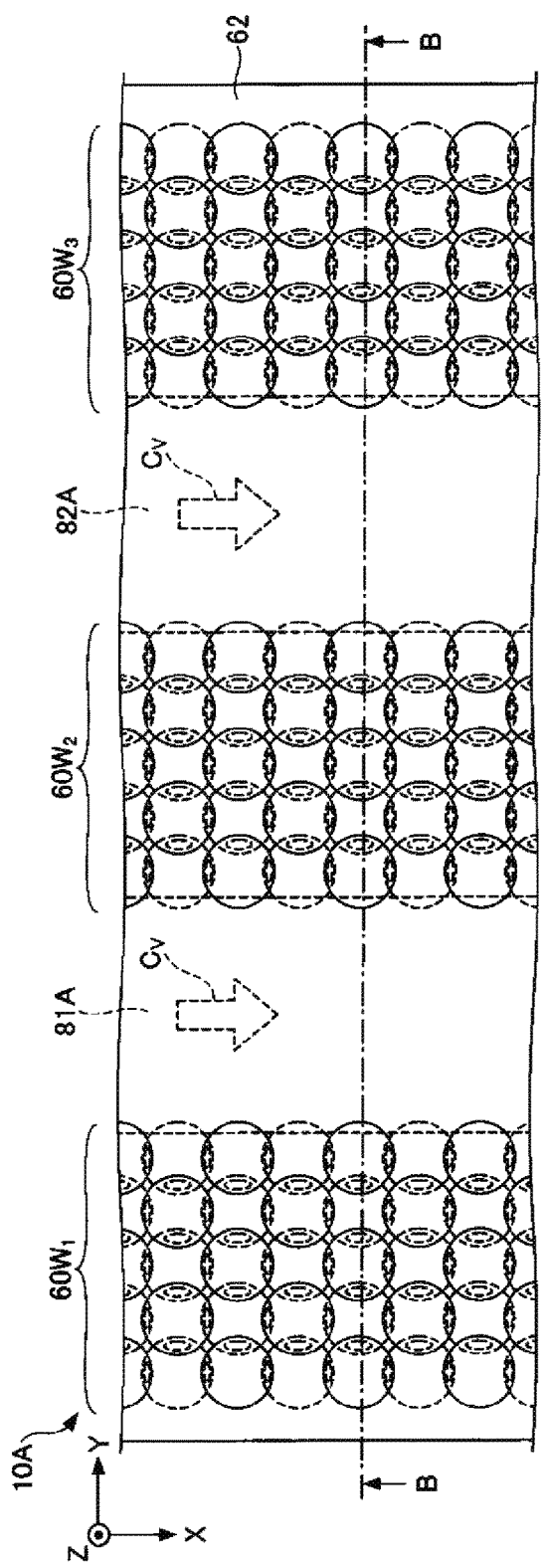
FIGS. 8A and 8B are views illustrating a porous member and spaces provided in an evaporator according to a second embodiment.
Figure 8B:
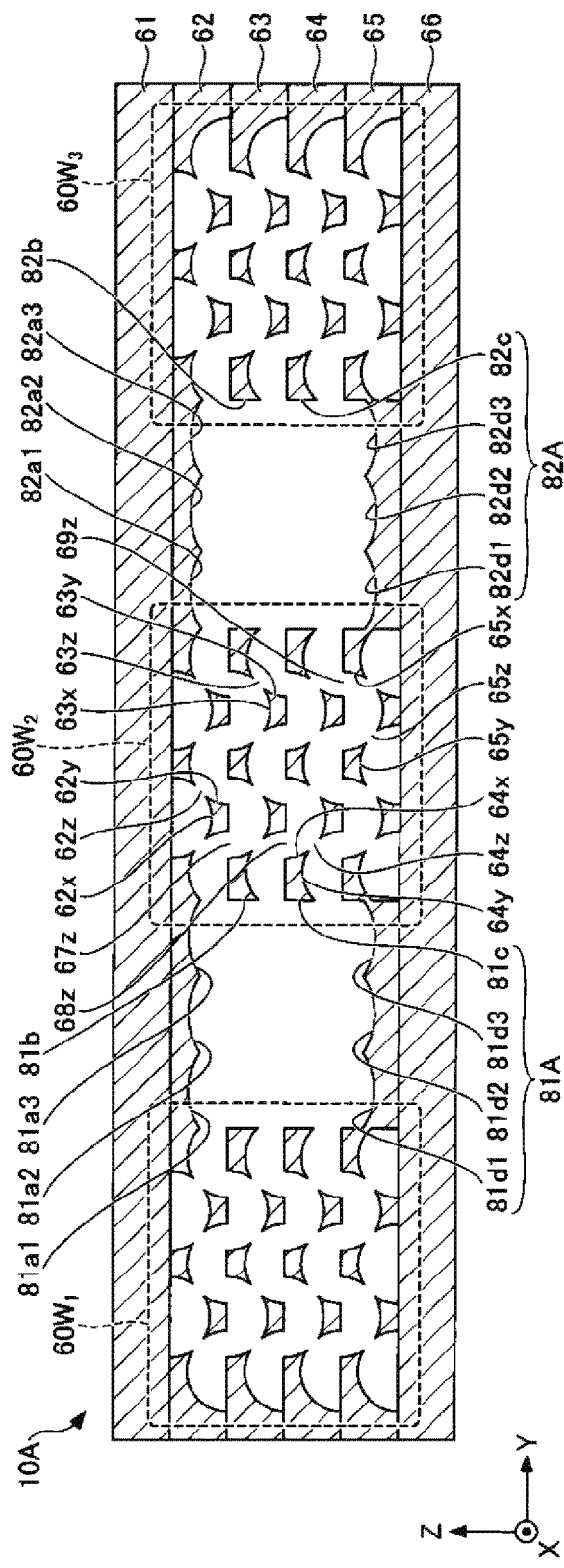

FIGS. 8A and 8B are views illustrating a porous member and spaces provided in the evaporator according to the second embodiment. FIG. 8A shows a partial enlarged plan view corresponding to FIG. 4A. FIG. 8B shows a section taken along a line 13-13 of FIG. 8A. However, FIG. 8B is a sectional view also including a metal layer 61 whose illustration as one (an uppermost layer) of outermost layers of a porous member 60 has been omitted from FIG. 8A. Incidentally, since an overall view of the evaporator 10A is similar to or the same as that in FIG. 3, illustration of the overall view of the evaporator 10A is omitted.

The evaporator 10A shown in FIGS. 8A and 8B is different from the evaporator 10 (see FIGS. 4A and 4B etc.) at a point that the spaces 81 and 82 are replaced with spaces 81A and 82A.

The space 81A is formed by bottomed grooves 81a1, 81a2 and 81a3, a through hole 81b, a through hole 81c, and bottomed grooves 81d1, 81d2 and 81d3 that communicate with one another. In addition, the space 82A is formed by bottomed grooves 82a1, 82a2 and 82a3, a through hole 82b, a through hole 82c, and bottomed grooves 82d1, 82d2 and 82d3 that communicate with one another.

More specifically, inside a metal layer 62, the bottomed grooves 81a1, 81a2 and 81a3 are arrayed in a Y direction with their length directions in an X direction, and opened to a metal layer 63 side so as to communicate with one another in a plane direction (the Y direction). In addition, inside the metal layer 62, the bottomed grooves 82a1, 82a2 and 82a3 are arrayed in the Y direction with their length directions in the X direction, and opened to the metal layer 63 side so as to communicate with one another in the plane direction (the Y direction).

Inside a metal layer 65, the bottomed grooves 81d1, 81d2 and 81d3 are arrayed in the Y direction with their length directions in the X direction, and opened to a metal layer 64 side so as to communicate with one another in the plane direction (the Y direction). In addition, inside the metal layer 65, the bottomed grooves 82d1, 82d2 and 82d3 are arrayed in the Y direction with their length directions in the X direction, and opened to the metal layer 64 side so as to communicate with one another in the plane direction (the Y direction).

A width of a largest opening portion of the bottomed grooves 81a1, 81a2 and 81a3 communicating with one another in the Y direction, a width of the through hole 81b, a width of the through hole 81c, and a width of a largest opening portion of the bottomed grooves 81d1, 81d2 and 81d3 communicating with one another in the Y direction are substantially the same. In a similar manner or the same manner, a width of a largest opening portion of the bottomed grooves 82a1, 82a2 and 82a3 communicating with one another in the Y direction, a width of the through hole 82b, a width of the through hole 82c, and a width of a largest opening portion of the bottomed grooves 82d1, 82d2 and 82d3 communicating with one another in the Y direction are substantially the same.

Each of the bottomed grooves 81a1, 81a2, 81a3, 81d1, 81d2 and 81d3 and the bottomed grooves 82a1, 82a2, 82a3, 82d1, 82d2 and 82d3 can be, for example, formed into a concave shape in which an inner wall surface of the bottomed groove includes a curved surface.

As for each of the bottomed grooves 81a1, 81a2, 81a3, 81d1, 81d2 and 81d3 and the bottomed grooves 82a1, 82a2, 82a3, 82d1, 82d2 and 82d3, a sectional shape parallel with a YZ plane can be, for example, formed as an approximately semicircular shape or an approximately semielliptical shape.

Thus, as for the bottomed grooves as the reinforcement portions, the sectional shapes parallel with the YZ plane may be formed into one approximately circular shape or one approximately elliptical shape or may be formed into a shape in which approximate circles or approximate ellipses are arrayed in the Y direction while communicating with one another.

To form one flow path shaped like an approximate circle or an approximate ellipse, one bottomed groove shaped like an approximate semicircle or an approximate semiellipse has to be formed by half-etching in each of adjacent ones of the metal layers. To form one bottomed groove shaped like an approximate semicircle or an approximate semiellipse by half-etching, the bottomed groove is etched in a depth direction and a width direction simultaneously. Therefore, a width of the bottomed groove is limited relatively to a thickness of the metal layer. Accordingly, it is difficult to form a reinforcement portion wide in the Y direction.

On the contrary, to form a reinforcement portion having a shape in which a plurality of approximate circles or approximate ellipses are arrayed in the Y direction while communicating with one another, a width of one bottomed groove shaped like an approximate circle or an approximate ellipse and formed by half-etching may be limited without any problem. Even when the width of one bottomed groove is limited due to the half-etching, a plurality of such bottomed grooves are arrayed in the Y direction while communicating with one another so that a reinforcement portion wide in the Y direction can be formed easily. That is, even when the width of one bottomed groove is limited, the width of the space and the reinforcement portion in the Y direction can be adjusted easily by changing the number of the bottomed grooves communicating with one another.

Incidentally, a reinforcement portion in which three approximate circles or three approximate ellipses are arrayed in the Y direction while communicating with one another has been illustrated as the sectional shape of the flow path parallel with the YZ, direction in the example of FIGS. 8A and 8B. However, the present disclosure is not limited thereto. For example, as the sectional shape parallel with the YZ plane, a reinforcement portion where two approximate circles or two approximate ellipses are arrayed in the Y direction while communicating with each other may be formed or a reinforcement portion where at least four approximate circles or at least four approximate ellipses are arrayed in the Y direction while communicating with one another may be formed.

<Modification 1>

An example where the sizes of bottomed holes communicating with each other in a thickness direction vary from each other will be shown in Modification 1. Incidentally, description about the same constituent portions as those in the aforementioned embodiment may be omitted in Modification 1.

Figure 9:
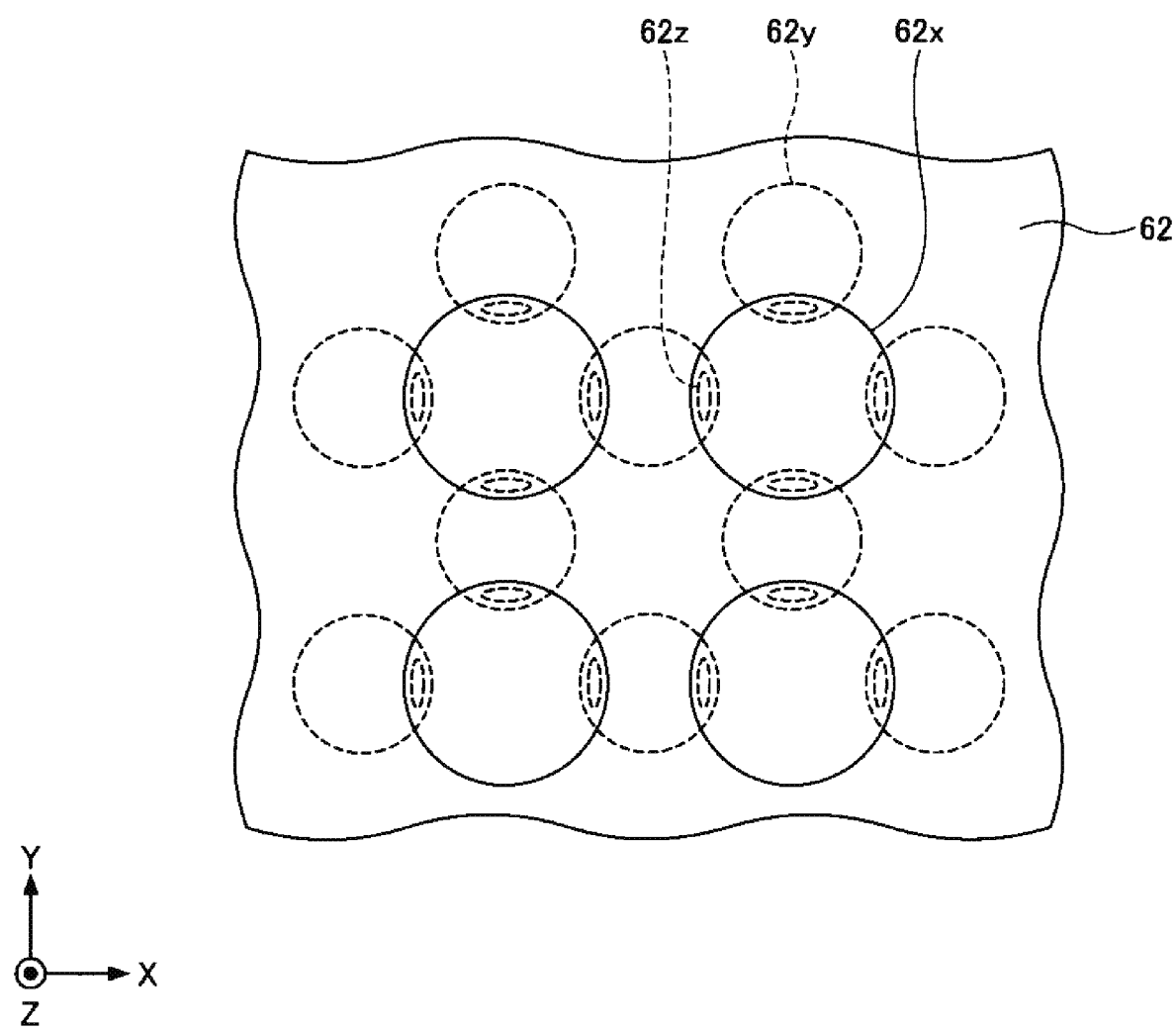
FIG. 9 is a view showing an example in which the sizes of bottomed holes communicating with each other in a thickness direction vary from each other.

FIG. 9 is a view showing the example in which the sizes of the bottomed holes communicating with each other in the thickness direction vary from each other. As shown in FIG. 9, for example, in a metal layer 62, the size of each of bottomed holes 62$x$ may be made larger than the size of each of bottomed holes 62$y$, and a plurality of bottomed holes 62$y$ may be disposed around the bottomed hole 62$x$ in plan view.

Thus, the volume of a space is widened with the increase of the size of some of the bottomed holes. Accordingly, pressure loss of a working fluid C flowing in the bottomed holes can be reduced.

Although the metal layer 62 has been described above by way of example, each of metal layers 63 to 65 can be formed into a structure similar to or the same as that of the metal layer 62 described with reference to FIG. 9.

In addition, Modification 1 can be applied to the first and second embodiments.

<Modification 2>

An example in which a porous member has grooves in addition to bottomed holes will be shown in Modification 2. Incidentally, description about the same constituent portions as those in the aforementioned embodiments may be omitted in Modification 2.

Figure 10:
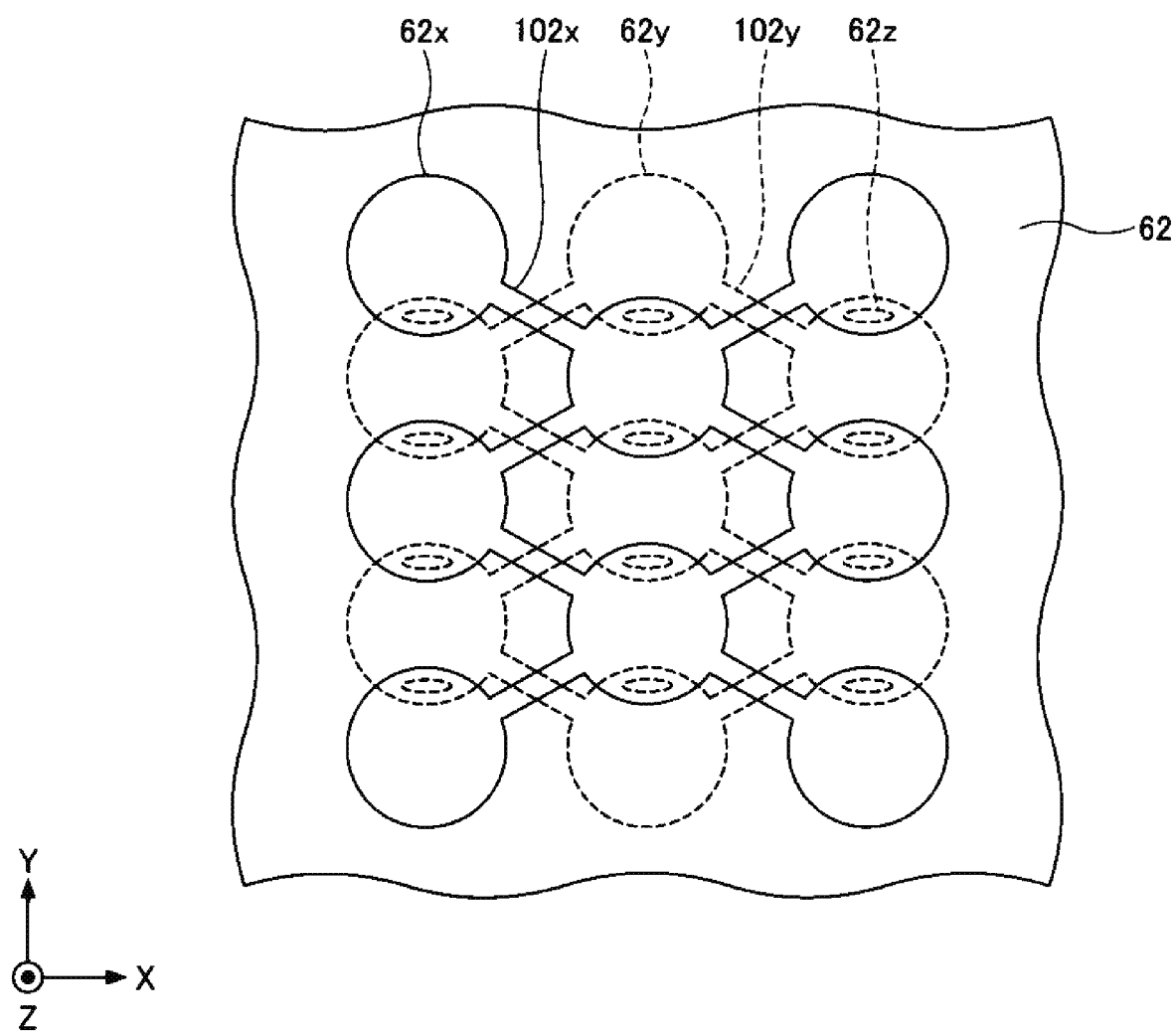
FIG. 10 is a view showing an example in which bottomed holes and grooves are provided in one metal layer.

FIG. 10 is a view showing an example in which the bottomed holes and the grooves are provided in one metal layer. As shown in FIG. 10, for example, grooves 102$x$ each of hick is recessed from an upper surface side of the metal layer 62 toward a central portion side of the metal layer 62, and grooves 102$y$ each of which is recessed from a lower surface side of the metal layer 62 toward a central portion side of the metal layer 62 may be provided in the metal layer 62. In FIG. 10, adjacent ones of the bottomed holes 62$x$ communicate with each other by one groove 102$x$, and adjacent ones of the bottomed holes 62$y$ communicate with each other by one groove 102$y$. The grooves 102$x$ and 102$y$ can be formed by half etching in a similar manner to or the same manner as the bottomed holes. Incidentally, the grooves 102$x$ and the grooves 102$y$ do not communicate with each other.

Thus, due to adjacent ones of the bottomed holes communicating with each other through one groove, permeability of a working fluid C can be assisted. Incidentally, even when either the grooves 102$x$ or the grooves 102$y$ are provided, a fixed effect can be obtained.

The metal layer 62 has been described above by way of example. However, each of metal layers 63 to 65 can be also formed into a structure similar to or the same as that of the metal layer 62 that has been described with reference to FIG. 10.

Modification 2 can be applied to the first and second embodiments. Although preferred embodiments have been described above in detail, the disclosure is not limited to the aforementioned embodiments, but various modifications and replacements can be added to the aforementioned embodiments without departing from the scope described in Claims.

For example, the layout of the bottomed holes is limited to the aforementioned embodiments (plan views) but may be modified or changed variously.

For example, the protrusions of the porous member may be formed not in all the metal layers except the outermost metal layers of the layered metal layers. In the case of a structure in which six metal layers are layered on one another, for example, the protrusions may be formed, for example, only in a third metal layer and a fifth metal layer.

Various aspects of the subject matter described herein are set out non-exhaustively in the following numbered clauses:

1) A method of manufacturing a loop-type heat pipe, wherein the loop-type heat pipe comprises:

an evaporator that vaporizes a working fluid;

a condenser that liquefies the working fluid;

a liquid pipe by which the evaporator and the condenser are connected to each other, and a vapor pipe by which the evaporator and the condenser are connected to each other, wherein the vapor pipe and the liquid pipe form a loop, wherein the evaporator is formed by layered metal layers that comprise:

a first outermost metal layer positioned on one outer side in a layering direction of the layered metal layers;

a second outermost metal layer positioned on the other outer side opposite to the one outer side in the layering direction; and an inner layer positioned between the first outermost metal layer and the second outermost metal layer, wherein the inner layer comprises:

a first metal layer adjacent to the first outermost metal layer; and a second metal layer adjacent to the second outermost metal layer, wherein at least one space where vapor generated by vaporizing the working fluid flows and a porous member that communicates with the at least one space are provided in the inner layer, the method comprising:

a) forming the at least one space in the inner layer;

the step (a) comprising:

half-etching a first metal sheet that will serve as the first metal layer to thereby form a first bottomed groove;

half-etching a second metal sheet that will serve as the second metal layer to thereby form a second bottomed groove; and disposing the first metal sheet on the second metal sheet such that the first bottomed groove and the second bottomed groove are opposed to each other, one end of the space in the layering direction corresponds to a portion of the first metal sheet where the first bottomed groove is formed, and the other end of the space in the layering direction corresponds to a portion of the second metal sheet where the second bottomed groove is formed.

What is claimed is:

1. A loop-type heat pipe comprising:
an evaporator that vaporizes a working fluid;
a condenser that liquefies the working fluid;
a liquid pipe by which the evaporator and the condenser are connected to each other; and
a vapor pipe by which the evaporator and the condenser are connected to each other, wherein the vapor pipe and the liquid pipe form a loop,
wherein the evaporator is formed by layered metal layers that comprise:
a first outermost metal layer positioned on one outer side in a layering direction of the layered metal layers;
a second outermost metal layer positioned on an other outer side opposite to the one outer side in the layering direction; and
an inner layer positioned between the first outermost metal layer and the second outermost metal layer,
wherein the inner layer is formed of a plurality of layered metal layers, the plurality of layered metal layers comprising:
a first metal layer adjacent to the first outermost metal layer; and
a second metal layer adjacent to the second outermost metal layer,
wherein a space where vapor generated by vaporizing the working fluid flows and a porous member that communicates with the space are provided in the inner layer,
wherein
the first metal layer is formed with a first bottomed groove opened to a side of the second metal layer, and
the second metal layer is formed with a second bottomed groove opened to a side of the first metal layer side, wherein
one end of the space in the layering direction is closed by a portion of the first metal layer where the first bottomed groove is formed, and
an other end of the space in the layering direction is closed by a portion of the second metal layer where the second bottomed groove is formed, and
wherein the portion of the first metal layer where the first bottomed groove is formed and the portion of the second metal layers where the second bottomed groove is formed are not portions of the porous member.

2. The loop-type heat pipe according to claim 1, wherein the plurality of layered metal layers of the inner layer further comprises a third metal layer disposed between the first metal layer and the second metal layer,
a through hole is formed through the third metal layer, and
the first bottomed groove, the through hole, and the second bottomed groove communicate with one another in the layering direction to thereby form the space.

3. The loop-type heat pipe according to claim 1, wherein each of the first bottomed groove and the second bottomed groove has a concave shape, and
an inner wall surface of each of the first and second bottomed grooves includes a curved surface.

4. The loop-type heat pipe according to claim 1, wherein the first bottomed groove comprises a plurality of first bottomed grooves that are arranged in a first direction and opened to a side of the second metal layer, wherein one of the plurality of first bottomed grooves communicates with adjacent one of the plurality of first bottomed grooves,
the second bottomed groove comprises a plurality of second bottomed grooves that are arranged in the first direction and opened to a side of the first metal layer, wherein one of the plurality of second bottomed grooves communicates with adjacent one of the plurality of second bottomed grooves, and
the space comprises a plurality of spaces, each of the plurality of spaces having ends in the layering direction closed by a respective pairing of one of the plurality of first bottomed grooves and one of the plurality of second bottomed grooves.

5. The loop-type heat pipe according to claim 4, wherein each of the plurality of first and second bottomed grooves has a concave shape, and
an inner wall surface of each of the plurality of first and second bottomed grooves includes a curved surface.

6. The loop-type heat pipe according to claim 1, wherein the porous member is formed into a shape of comb teeth that has a coupling portion and protrusions,
one end of each of the protrusions is coupled with the coupling portion in plan view, and
the space is provided between adjacent ones of the protrusions in plan view.

7. The loop-type heat pipe according to claim 1, wherein the porous member comprises:
a first bottomed hole that is recessed from one surface of the first metal layer or the second metal layer;
a second bottomed hole that is recessed from an other surface of the first metal layer or the second metal layer, wherein the other surface is opposite to the one surface; and
a narrow hole, wherein the first bottomed hole and the second bottomed hole partially communicate with each other through the narrow hole.

8. The loop-type heat pipe according to claim 1, wherein no through hole or groove is formed in the first outermost metal layer and the second outermost metal layer.

* * * * *